(12) United States Patent
Yang et al.

(10) Patent No.: US 8,730,081 B2
(45) Date of Patent: May 20, 2014

(54) CALIBRATION IN MULTIPLE SLOPE COLUMN PARALLEL ANALOG-TO-DIGITAL CONVERSION FOR IMAGE SENSORS

(75) Inventors: Zheng Yang, San Jose, CA (US); Guangbin Zhang, Cupertino, CA (US); Yuanbao Gu, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 24 days.

(21) Appl. No.: 13/423,976

(22) Filed: Mar. 19, 2012

(65) Prior Publication Data

US 2013/0242125 A1    Sep. 19, 2013

(51) Int. Cl.
| | | |
|---|---|---|
| H03M 1/82 | (2006.01) | |
| H03M 1/12 | (2006.01) | |
| H03M 1/56 | (2006.01) | |
| H04N 5/228 | (2006.01) | |
| H04N 5/217 | (2011.01) | |
| H04N 3/14 | (2006.01) | |
| H04N 5/225 | (2006.01) | |
| H01L 27/00 | (2006.01) | |

(52) U.S. Cl.
USPC ........ 341/167; 341/155; 341/169; 348/222.1; 348/241; 348/294; 348/300; 348/308; 250/208.1

(58) Field of Classification Search
USPC ............. 250/208.1; 341/155–172; 348/222.1, 348/241–251, 294–324
See application file for complete search history.

(56) References Cited

U.S. PATENT DOCUMENTS

| | | | | |
|---|---|---|---|---|
| 6,646,586 | B1 * | 11/2003 | Lee et al. | 341/167 |
| 7,554,479 | B2 * | 6/2009 | Lim | 341/169 |
| 2001/0050628 | A1 * | 12/2001 | Yoda | 341/167 |
| 2003/0016154 | A1 * | 1/2003 | Yamamoto | 341/167 |
| 2006/0012698 | A1 * | 1/2006 | Nitta et al. | 348/308 |
| 2007/0046513 | A1 * | 3/2007 | Ham et al. | 341/118 |
| 2007/0138375 | A1 * | 6/2007 | Lee et al. | 250/214 R |
| 2008/0170137 | A1 * | 7/2008 | Matsumoto et al. | 348/241 |
| 2009/0040351 | A1 * | 2/2009 | Cho | 348/308 |
| 2009/0225211 | A1 * | 9/2009 | Oike | 348/308 |
| 2011/0080512 | A1 * | 4/2011 | Ay | 348/308 |
| 2012/0050082 | A1 * | 3/2012 | Danesh et al. | 341/122 |
| 2012/0212657 | A1 * | 8/2012 | Mo et al. | 348/300 |
| 2012/0242877 | A1 * | 9/2012 | Tanaka | 348/294 |
| 2013/0027592 | A1 * | 1/2013 | Sugiura et al. | 348/243 |
| 2013/0070135 | A1 * | 3/2013 | Bahukhandi et al. | 348/300 |
| 2013/0100326 | A1 * | 4/2013 | Ueno | 348/300 |
| 2013/0215302 | A1 * | 8/2013 | Ueno | 348/300 |

OTHER PUBLICATIONS

Kwon, et al., "A Novel Double Slope Analog-to-Digital Converter for a High Quality 640X480 CMOS Imaging System", *Proc. IEEE Int. Conf. VLSI and CAD*, Oct. 1999, pp. 335-338.

(Continued)

*Primary Examiner* — Michael Osinski
(74) *Attorney, Agent, or Firm* — Blakely Sokoloff Taylor & Zafman LLP

(57) ABSTRACT

A method of an aspect includes acquiring analog image data with a pixel array, and reading out the analog image data from the pixel array. The analog image data is converted to digital image data by performing an analog-to-digital (A/D) conversion using a multiple slope voltage ramp. At least some of the digital image data is adjusted with calibration data. Other methods, apparatus, and systems, are also disclosed.

11 Claims, 7 Drawing Sheets

(56) References Cited

OTHER PUBLICATIONS

Otaka, et al., "12-bit Column-parallel ADC with Accelerated Ramp", *Proc. IEEE Workshop CCDs Adv. Image Sensors*; Jun. 2005, pp. 173-176.

Snoeij, et al., "Multiple-ramp Column-parallel ADC Architecture for CMOS Image Sensors", *IEEE J. Solid State Circuits*, vol. 42, No. 12, Dec. 1997, pp. 2968-2977.

Snoeij, et al., "A CMOS Image Sensor with a Column-Level Multiple-Ramp Single-Slope ADC", *ISSCC 2007/ Session 28/ Image Sensors/ 28.4*, 2007 IEEE International Solid-State Circuits Conference.

Yoshihara, et al., "A 1/1.8 inch 6.4 Mpixel 60 frames/s CMOS Image Sensor with Seamless Mode Change", *IEEE J. Solid State Circuits*, vol. 41, No. 12. Dec. 2006, pp. 2998-3006.

* cited by examiner

CALIBRATION IN MULTIPLE SLOPE COLUMN PARALLEL ANALOG-TO-DIGITAL CONVERSION FOR IMAGE SENSORS

BACKGROUND

1. Field

Embodiments of the invention relate to the field of image sensors, and more particularly to multiple slope column parallel analog-to-digital conversion for image sensors.

2. Background Information

Image sensors are ubiquitous. They are widely used in digital still cameras, digital video cameras, cellular phones, security cameras, medical devices, automobiles, and other applications.

Many image sensor applications benefit from fast processing speed. One way to achieve a fast processing speed is to increase the speed with which the image sensor is able to read out a captured image. The readout circuitry of image sensors commonly includes analog-to-digital (A/D) converters that convert analog voltages output from the pixel array into digital values used to construct a digital image. Column parallel A/D conversion architectures, where each column readout line or bit line is electrically coupled to a corresponding A/D converter, have been used to increase the readout speed of image sensors.

One type of readout uses a single-ramp single-slope (SRSS) column parallel A/D conversion. The term single ramp means that the reference voltage ramp signal makes only a single pass over the full reference voltage ramp range. The term single slope means that the reference voltage ramp signal has a single constant slope across the full reference voltage ramp range.

FIG. 1 is a block diagram of image sensor 100 having a column parallel A/D conversion architecture. The image sensor includes control circuitry 102, pixel array 104, readout circuitry 120 and digital processing logic 128. For simplicity of illustration, the illustrated pixel array includes only first column 106-1 having four pixel cells 108, and second column 106-2 having four pixel cells 108. It is to be appreciated that actual image sensors commonly include from hundreds to thousands of columns, and each column commonly includes from hundreds to thousands of pixels.

During use, after each pixel cell has acquired its image data or charge, the image data or charge may be read out of the pixel cells to readout circuitry 120 on column readout lines or bit lines 110-1, 110-2. There may be one bit line per column of the pixel array, and one row of pixel cells may be read out at a time using the bit lines for all of the columns. The readout circuitry may include a separate A/D converter 114-1, 114-2 for each corresponding bit line and/or column of the pixel array. That is, each column may share a portion of the readout circuitry that includes a corresponding A/D converter 114. As shown, each bit line and/or column may also have a corresponding column amplifier 112-1, 112-2 to amplify the image data or charge.

Each A/D converter includes corresponding comparator 116-1, 116-2 and latch 118-1, 118-2. Each of the comparators has two input terminals. The amplified image data from the column amplifiers may be provided to non-inverting input terminals of the comparators (i.e., the "+" terminals in the illustration). The readout circuitry also includes voltage ramp generator 122. The voltage ramp generator may generate and output a voltage ramp signal (VRAMP). The voltage ramp signal may be coupled with inverting input terminals of the comparators (i.e., the "−" terminals in the illustration). The voltage ramp signal may ramp up, for example in a saw tooth voltage ramp, from an initial voltage (e.g., 0V) to a final, full scale voltage ($V_{FS}$). In another implementation, the + and − terminals may be exchanged. In some implementation, a single-ended comparator may be used, which takes a single input that is equal to the difference between VRAMP and a column amp output.

The readout circuitry also includes a counter 124. The counter increments while the voltage ramp signal (VRAMP) is applied. By way of example, the counter may be an N-bit counter, where N represents the resolution in bits of the A/D converters and/or the number of bits in the digital output values. Commonly, N may range from about 6-bits to 12-bits, or more. During each A/D conversion, the N-bit counter may increment from 0 to $2^N-1$. By way of example, in the particular case of 8-bits, the counter may count from 0 to 255, where each different count may represent a different digital level to which analog voltages from the pixel cells are to be mapped during A/D conversion. The counter may increment during clock cycles such that an N-bit A/D conversion may take approximately $2^N$ clock cycles to complete. The counter is coupled to provide output counter signal 126 to each latch 118-1, 118-2 for each corresponding column.

The comparators may compare the input voltage ramp signal (VRAMP) with the input amplified analog input voltages from the pixel cells (e.g., of the row being output). The outputs of the comparators are coupled to the inputs of the corresponding latches. When a comparator determines that the input voltage ramp signal (VRAMP) matches the amplified analog input voltages from the corresponding pixel cell in the corresponding column, the corresponding latch may latch output counter signal 126. The latched counter signal may represent the digital level to which the amplified analog input voltage from the pixel cell has been mapped during the A/D conversion. When the voltage ramp signal does not match the amplified analog input voltages from the corresponding pixel cell in the corresponding column, then the corresponding latch does not latch the output counter signal (e.g., VRAMP is allowed to further increase while the counter continues to count until at some point the values match). In an alternate implementation, rather than a global counter and local latches, local counters may be used, and when a comparator triggers, the corresponding local counter may stops counting. The latched counter signal values may be output from the latches to digital processing logic 128. If desired, the values may be transferred in parallel to a buffer (e.g., a random access memory buffer), and then sequentially output to the digital processing logic.

Such an SRSS A/D conversion is commonly used to readout image data of image sensors. However, the use of such SRSS A/D conversions generally tends to provide relatively slow conversion times (e.g., of $2^N$ clock cycles). In various applications, such slow conversion times tend to have drawbacks, especially when relatively high resolutions are used. Reducing the conversion time would offer certain advantages.

BRIEF DESCRIPTION OF THE SEVERAL VIEWS OF THE DRAWINGS

The invention may best be understood by referring to the following description and accompanying drawings that are used to illustrate embodiments of the invention. In the drawings.

DETAILED DESCRIPTION

In the following description, numerous specific details are set forth, such as, for example, specific readout circuits, voltage ramp signals, calibration circuits, orders of operations, etc. However, it is understood that embodiments of the invention may be practiced without these specific details. In other instances, well-known circuits, structures and techniques have not been shown in detail in order not to obscure the understanding of this description.

As previously mentioned, SRSS A/D conversions tend to have relatively slow conversion times. In some embodiments, analog image data may be converted to digital image data by performing an analog-to-digital (A/D) conversion using a multiple slope voltage ramp (e.g., a single ramp multiple slope (SRMS) approach). In the SRMS approach, for each set of analog input values to be converted (e.g., each row of pixels), the voltage ramp signal may make one pass over the analog input voltage range, and the slope of the voltage ramp signal versus time may change at least once (i.e., the voltage ramp signal has at least two different slopes). One advantage the SRMS approach is that faster conversion times may potentially be achieved (e.g., when the slope increases). However, one challenge when using a multiple slope voltage ramp (e.g., an SRMS approach), is that non-idealities may be encountered when implementing the multiple slope voltage ramp. In some embodiments, calibration may be used to at least partially account for these non-idealities and/or to improve image quality.

Figure 2:
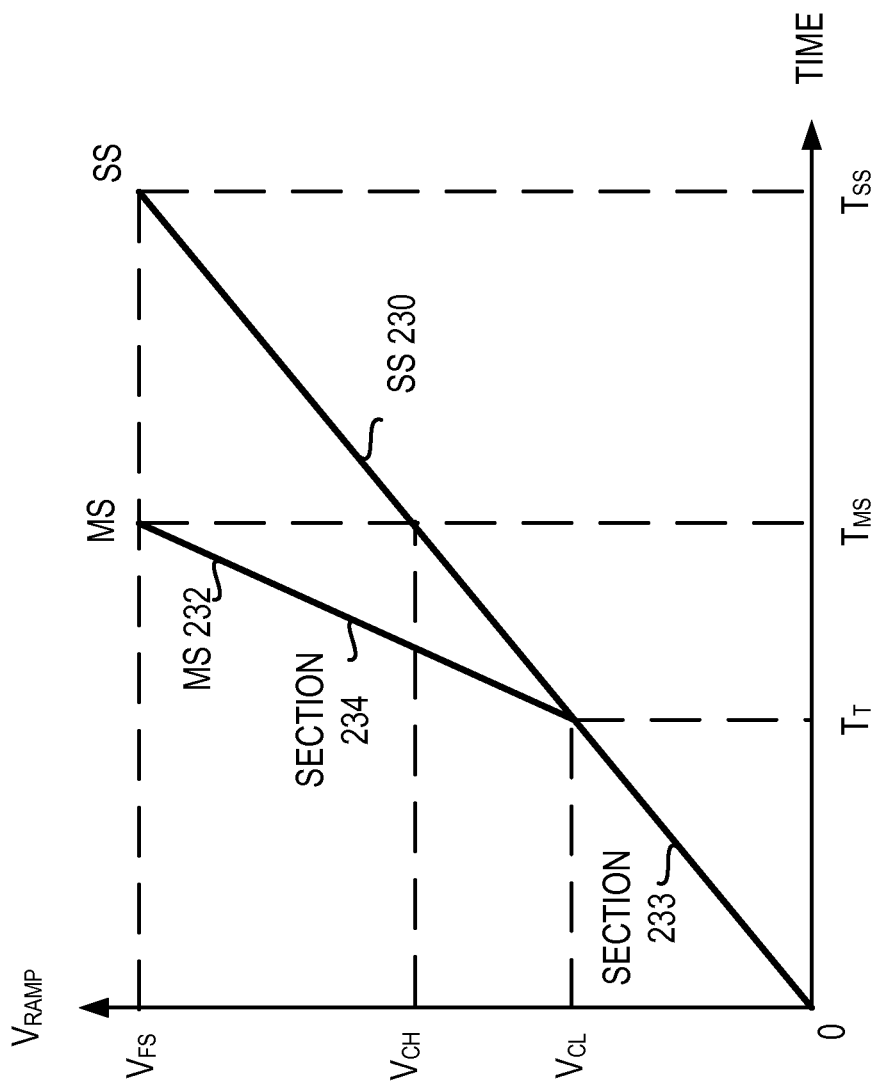
FIG. 2 is a graph illustrating examples of a single slope voltage ramp signal and a multiple slope voltage ramp signal.

FIG. 2 is a graph illustrating both a single slope (SS) voltage ramp signal (VRAMP) and a multiple slope (MS) voltage ramp signal. In the graph, time is plotted on the horizontal axis, and the voltage ramp signal is plotted on the vertical axis. SS line 230 shows the increase of the voltage ramp from 0V to a full scale voltage ($V_{FS}$) over time for the SS voltage ramp signal. With the SS voltage ramp signal, the complete voltage ramp signal and/or each A/D conversion takes time $T_{SS}$. MS lines 232 show the increase of the voltage ramp signal from 0V to the full scale voltage ($V_{FS}$) over time for the MS voltage ramp signal. In the illustrated example, initially the SS and MS voltage ramps have the same slope shown by section 233 from time 0 to time $T_T$. At time $T_T$, the slope of the MS voltage ramp signal changes (e.g., in this case increases). After time $T_T$, the MS voltage ramp signal has a slope shown by section 234 which is different than the slope of the SS voltage ramp signal. Increasing the slope of the MS voltage ramp signal provides a greater increase in the voltage ramp signal per unit time, which decreases the amount of time needed to reach the full scale voltage ($V_{FS}$). As shown, with the MS voltage ramp signal, the time to reach the full scale voltage ($V_{FS}$) and/or each A/D conversion takes time $T_{MS}$, which is less than time $T_{SS}$ for the SS voltage ramp signal. Advantageously, this may help to reduce the time needed for reading out analog image data.

Commonly, the reduced readout time may be achieved without significant increase in image noise. There tends to be an increase in signal related noise (e.g., photon shot noise) with increasing signal magnitude in image sensors. Photon shot noise tends to be approximately directly proportional to the square root of the input voltage. As the input voltage increases, shot noise becomes dominant over other sources of noise including quantization noise. Accordingly, for relatively large input voltages, the amount of quantization noise may be increased without significantly degrading the overall signal to noise ratio (SNR). With MS voltage ramps, when slope of the voltage ramp increases for larger input signals, the quantization step and quantization noise may also increase.

Recall that the comparator in an A/D converter compares the voltage ramp signal with the analog input voltage readout from the pixel array, and that the value of the counter when the two voltages are equal is taken as the digital representation of the analog input voltage (it is to be understood that this encompasses offsets and delays associated with real comparators). When the slope of the voltage ramp changes, the time taken to achieve a given count, before a given voltage is achieved by the ramp (e.g., before a voltage is latched), also changes. Accordingly, when the time needed for the voltage ramp to reach the full scale voltage ($V_{FS}$) decreases, the time needed to complete an A/D conversion also decreases. As shown in FIG. 2, the conversion time for an SRMS A/D conversion is $T_{MS}$, while for an SRSS A/D conversion the conversion time is $T_{SS}$ which is greater. The counter may count at a constant rate from its initial value to its maximum value even after the slope of the voltage ramp changes. Alternatively, as previously mentioned a local counter architecture may be used where each counter counts until a corresponding comparator triggers. If the speed of the counter(s) (i.e., how fast it counts) does not increase when the slope of the voltage ramp signal increases in an MS voltage ramp, then the counter may not count or increment to the same high value that it would if an SS voltage ramp were used by the time the voltage ramp signal matches the analog input voltage. Since, for a given analog input voltage, the digital output will be different depending on whether a single ramp or multiple ramp A/D conversion is used. Accordingly, the counter values determined by SS and MS voltage ramp A/D conversions may differ after the slope of the MS voltage ramp signal changes.

To interpret the output of an SRMS A/D conversion it is generally beneficial to accurately know the shape of the MS voltage ramp signal (i.e., the voltages at particular times), especially at and around points where the slope changes. The output of the SRMS A/D conversion is commonly transformed to that of an SRSS A/D conversion. Although the change in the slope of the voltage ramp signal may be triggered at a precise time (e.g., time $T_T$ in FIG. 2), non-idealities may make it difficult to accurately know the shape of the MS voltage ramp signal at and around points where the slope changes. Without wishing to be bound by theory, such non-idealities may be due in part to circuit variations, delays in the ramp generator, delays in the column comparators, or some combination of such factors. When interpreting the digital data output from SRMS A/D conversions, not taking such non-idealities into account may tend to lead to image artifacts (e.g., dips, bumps, or other distortions in a histogram plot of the number of digital codes present in the image). The calibration disclosed herein helps convert or relate digital values determined by SRMS A/D conversions to those determined by SRSS A/D conversions. The calibration disclosed herein also helps to account for non-idealities associated with the SRMS A/D conversions in order to reduce image artifacts and/or improve image quality.

Figure 3:
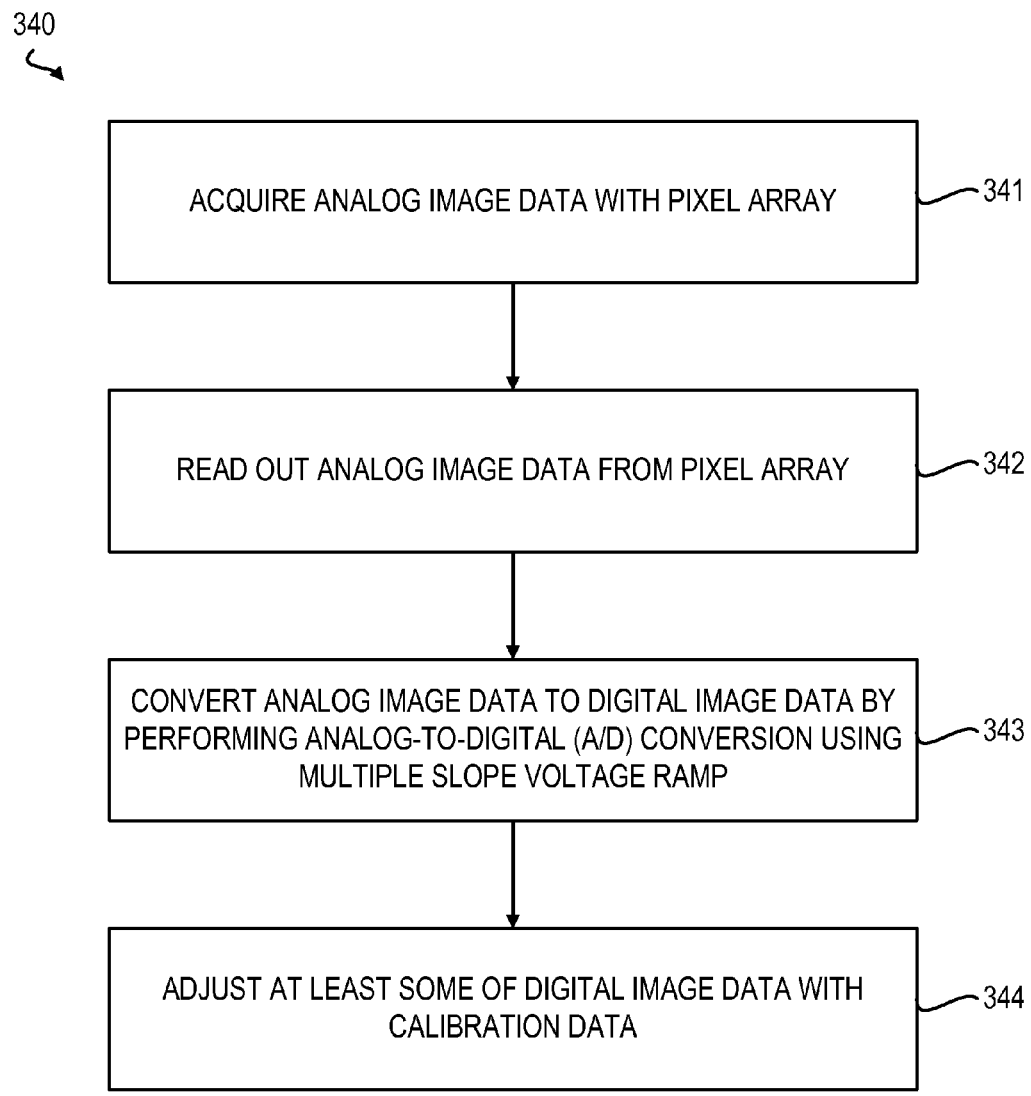
FIG. 3 is a block flow diagram of an example embodiment of a method of using calibration data to adjust digital image data in an image sensor.

FIG. 3 is a block flow diagram of an example embodiment of a method 340 of using calibration data to adjust digital image data in an image sensor. The method includes acquiring analog image data with a pixel array, at block 341. The analog image data is read out from the pixel array, at block 332. For example, analog image data for a row of pixels may be read out from the pixel array on a set of per-column bit lines. The analog image data may be converted to digital image data by performing an A/D conversion using a multiple slope voltage ramp, at block 343. In some embodiments, a single ramp multiple slope (SRMS) voltage ramp may be used. At least some of the digital image data may be adjusted with calibration data, at block 344. For example, at least a portion of the digital image data proximate a point of a change in slope of the SRMS voltage ramp may be adjusted with digital calibration data (e.g., data immediately before the change in slope and for some amount of time after the change in the slope may be adjusted with the calibration data). In some embodiments, the digital calibration data may be used to relate or convert the output of the SRMS A/D conversion to that of an SRSS A/D conversion. In some embodiments, the digital calibration data may relate digital data converted from analog data using a multiple slope voltage ramp to digital data converted from analog data using a single slope voltage ramp.

Figure 1:
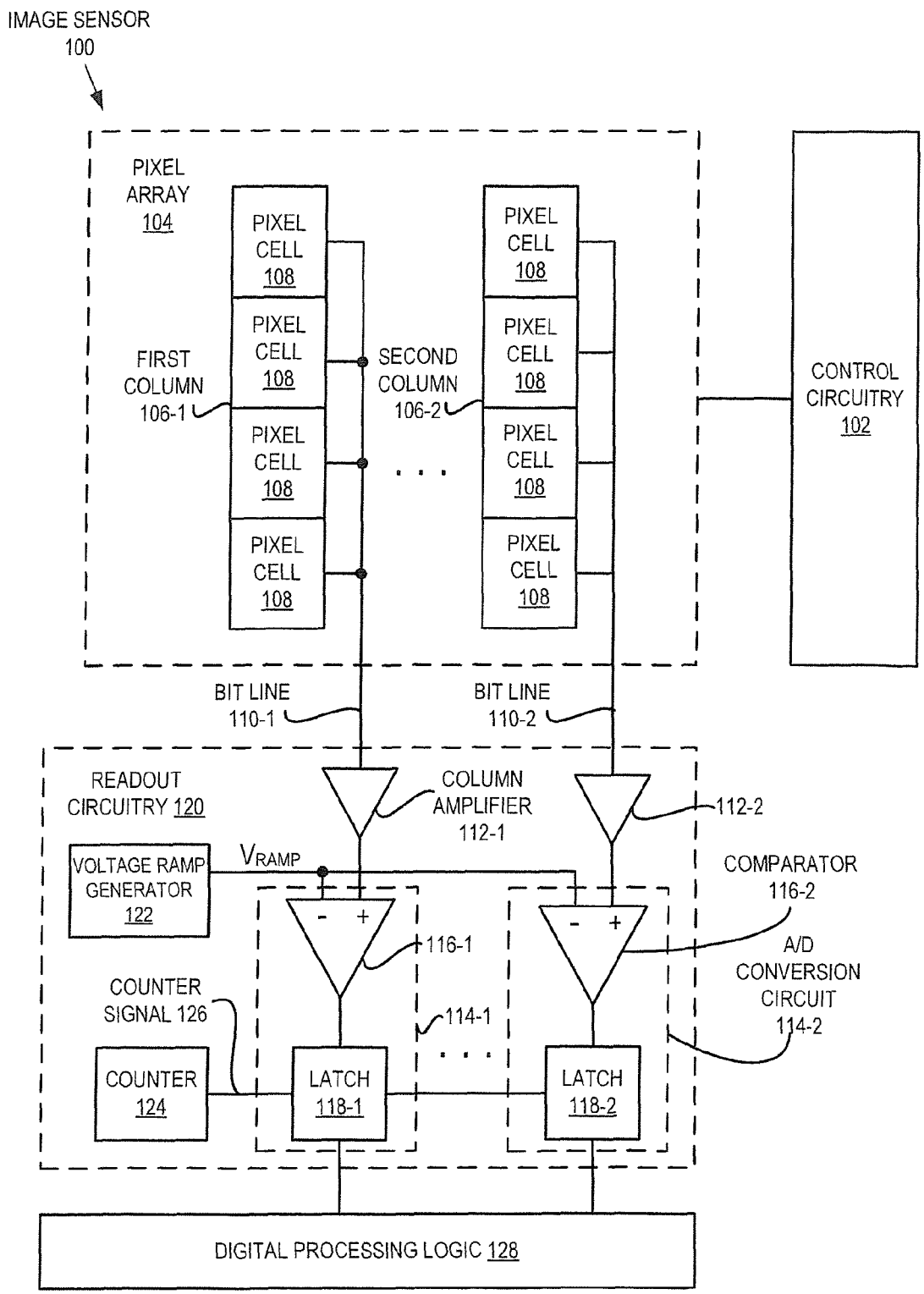
FIG. 1 is a block diagram of an example of an image sensor having a column parallel analog-to-digital conversion architecture.
Figure 4:
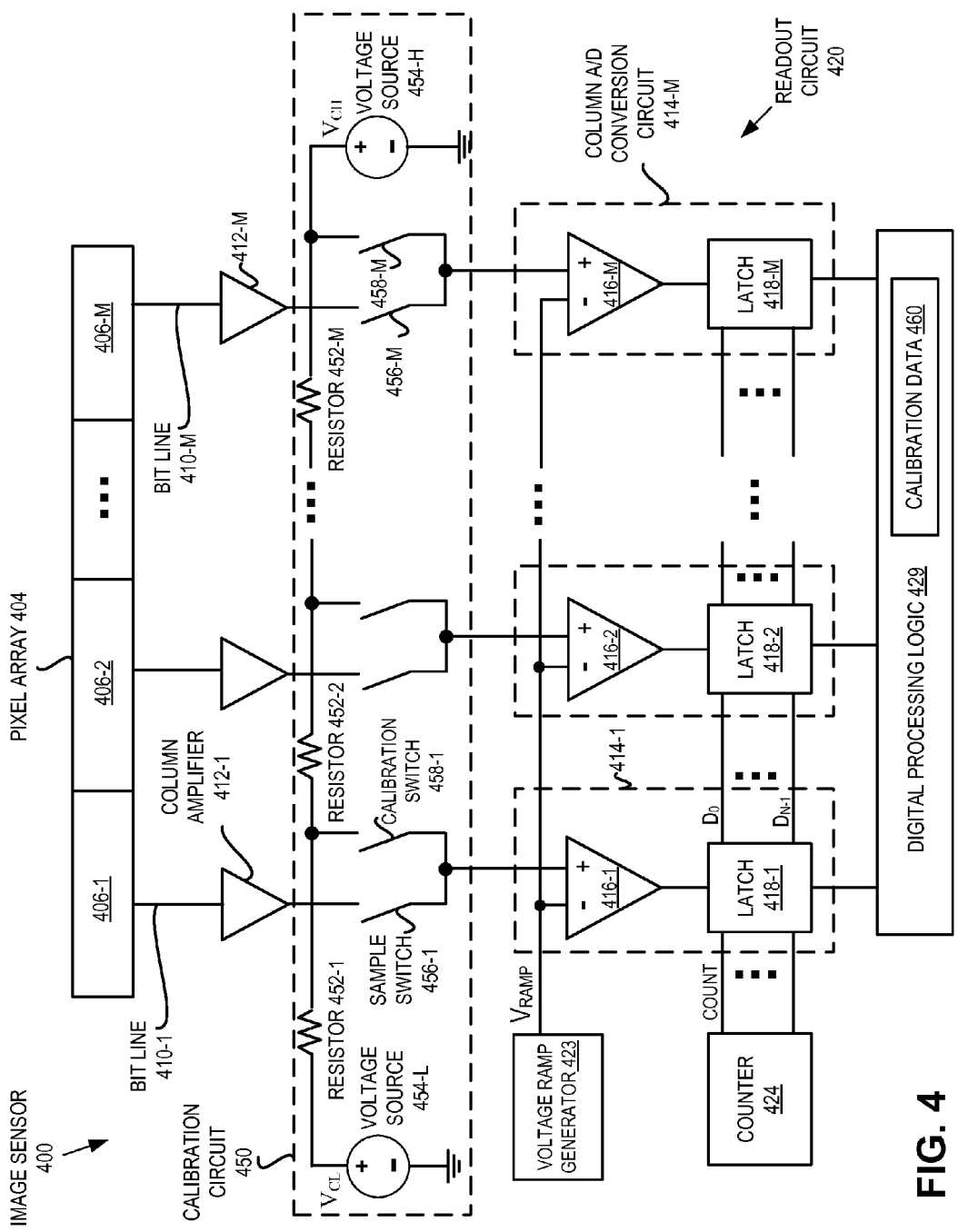
FIG. 4 is a block diagram of an example embodiment of an image sensor having an example embodiment of calibration circuitry.

FIG. 4 is a block diagram of an example embodiment of image sensor 400 having example embodiment of calibration circuitry 450. The image sensor includes pixel array 404, readout circuitry 420, and calibration circuitry 450. In the illustration, lines are used to show couplings of components. Unless otherwise specified, or apparent from the disclosure, and especially except for aspects altered by the incorporation of the calibration circuitry, the components shown in FIG. 4 may have similar or the same characteristics and operation as the correspondingly named components of FIG. 1. Although not shown, the image sensor may also include control circuitry, digital processing logic, as well as other conventional components.

The pixel array includes M columns 406-1 through 406-M. M generally ranges from hundreds to many thousands, although the scope of the invention is not limited to any known value of M. Each of the columns may include a number of rows of pixel cells. Commonly, the number of rows also ranges from hundreds to many thousands, although the invention is not so limited. A corresponding number M of bit lines 410-1 through 410-M are used to read analog voltages from the columns of the pixel array into the readout circuitry (e.g., one row of pixel cells at a time).

The readout circuitry includes a corresponding set of M readout circuitry portions. One readout circuitry portion is included for each of the M columns in the pixel array. As shown, each of the M readout circuitry portions may include a same set of components. In particular, each of the M readout circuitry portions may include corresponding optional column amplifier 412-1 through 412-M (collectively column amplifier 412) and corresponding column A/D converter or conversion circuit 414-1 through 414-M. In another embodiment, the column amplifiers may optionally be omitted. In another embodiment, a sample and hold circuit (not shown) may be coupled with the output of the column amplifiers. The column A/D conversion circuits are each operable to convert analog image data from the pixel array to digital image data. As shown, each of the column A/D conversion circuits may include corresponding comparator circuit or comparator 416-1 through 416-M (collectively comparator 416) and corresponding latch 418-1 through 418-M (collectively latch 418). The readout circuitry also includes voltage ramp generator 423 and counter 424. In some embodiments, the counter may be an N-bit counter, and each of the latches may be an N-bit latch, where N is the resolution in bits of the digital output data (e.g., commonly 6-bits to 12-bits or more). While the illustrated embodiment includes a global counter, in another embodiment column level counters may be used, or a combination of a global counter and one or more column level counters may be used. In some embodiments, the voltage ramp generator may be capable of alternately generating in a first state (e.g., under a first control) a single slope voltage ramp (e.g., which may be used to determine calibration data), and in a second state (e.g., under a second control) a multiple slope voltage ramp (e.g., which may be used to determine calibration data and during A/D conversion of analog image data).

Referring again to FIG. 4, the image sensor also includes example embodiment of calibration circuitry 450. The A/D conversion circuitry is switchably coupled with the readout circuitry or calibration circuitry. The calibration circuitry is operable to measure or determine digital calibration data useful to adjust digital image data determined by A/D conversion using a multiple slope voltage ramp. In some embodiments, the calibration circuitry is operable to provide analog calibration data, which spans a calibration range, to the set of column A/D conversion circuits. The analog calibration data is provided to the set of column A/D conversion circuits, instead of the analog image data from the pixel array being provided to the set of column A/D conversion circuits, during a calibration phase.

The calibration circuitry includes a resistive ladder 452, low voltage source 454-L, and high voltage source 454-H. The low voltage source is operable to provide first low calibration voltage ($V_{CL}$). The high calibration voltage source is operable to provide second high calibration voltage ($V_{CH}$). Conventional types of voltage sources are suitable. The low and high calibration voltages span a range of voltages that are used for calibration. A first end of the resistive ladder is coupled with the low voltage source to receive the low calibration voltage ($V_{CL}$). A second end of the resistive ladder is coupled with the high voltage source to receive the high calibration voltage ($V_{CH}$). The resistive ladder includes a set of resistors 452-1 through 452-M coupled in series between the low and high voltage sources.

The resistors provide a set of fixed resistances, impedances, or voltage drops between the low and high voltage sources to create a set of fixed voltages at different points along the resistive ladder. A different voltage may exist on each side of each resistor. This may create a monotonic series of increasing voltages between the low and high voltage sources which span the calibration voltage range. In the illustrated embodiment, the fixed calibration voltages provided to the comparators increase from the leftmost column A/D conversion circuit to the rightmost column A/D conversion circuit. In another embodiment, the low and high voltage sources may be switched so that the fixed calibration voltages provided to the comparators decrease from the leftmost column A/D conversion circuit to the rightmost column A/D conversion circuit. In one embodiment, each of the resistors may have substantially the same impedance (e.g., they are designed to be the same rather than different although they may differ slightly due to manufacturing variations) to provide a substantially uniform separation of calibration voltages between adjacent column A/D conversion circuits. Alternatively, the resistors may have difference impedances to vary the separations of the calibration voltages between the adjacent column A/D conversion circuits.

The number of resistors included in the resistive ladder may vary from one embodiment to another depending upon the amount of calibration data points desired. Generally, more resistors are able to provide more and finer granularity calibration data. As shown, in one embodiment, for an M column pixel array, the resistor ladder may include approximately M resistors e.g., M resistors, M−1 resistors, or M+1 resistors) to provide a resistor between every pair of adjacent column readout circuits and/or column A/D conversion circuits. Alternatively, in other embodiments, the resistive ladder may include fewer or more resistors. For example, two or more resistors may be included between pairs of adjacent column readout circuits and/or column A/D conversion circuits, resistors may be included between only a subset of pairs of adjacent column readout circuits and/or column A/D conversion circuits, or a combination thereof (e.g., every other adjacent pair). In various embodiments, for an M column pixel array, there may be at least M/8, at least M/4, or at least M/2 resistors. Including less than M resistors may tend to reduce the amount and/or the granularity of the calibration data but may help to reduce power, circuit area, or circuit cost.

In such cases, sets of adjacent columns between two adjacent resistors would tend to have nearly identical output, although there may be some noise. If desired, the output from such sets of adjacent columns may be averaged, filtered, or otherwise processed to reduce the amount of noise. In yet another embodiment, the resistor ladder may include two or more selectable, or programmable resistors, between each rung of the ladder. This may allow the resistance to be selected, customized, or fine tuned post-manufacture.

In various embodiments, the range of voltages used for calibration may range from relatively large (e.g., the full multiple slope voltage ramp from 0V to $V_{FS}$) to relatively small (e.g., a small portion of the full multiple slope voltage ramp). Typically, the range of voltages used for calibration should include at least one point where the slope of the multiple slope voltage ramp changes in order to provide calibration data to help to account for non-idealities that may occur especially at and around the point where the slope changes. In one embodiment, the low calibration voltage is chosen to be a voltage just below, at, or just above a point at which the slope of the voltage ramp changes. In various embodiments, the high calibration voltage may be a point just far enough away from the low calibration voltages for non-idealities to stabilize, or may be the full scale voltage ($V_{FS}$).

The resistive ladder is just one possible way of creating different voltages spanning a calibration range for input to the A/D conversion circuits. In other embodiments, other circuits having a number of voltage drops may be used to provide the different voltages. For example, other circuit elements besides resistors, but having a resistance and/or are capable of generating a voltage gradient, may optionally be used. As one example, a series of transistors operating in a linear region so as to provide resistance may be used.

Referring again to the illustration, the calibration circuitry also includes, for each different voltage to be used for calibration, a set of one or more switches. In the illustrated embodiment, there are M sets of switches, one for each of the M columns of the pixel array, and within each set there are two switches. The two switches include sample switches 456-1 through 456-M (collectively sample switch 456) and calibration switches 458-1 through 458-M (collectively calibration switch 458).

The sample switches are operable to switchably, controllably, or selectively couple readout analog image data from the image array (e.g., amplified data output from the column amplifiers) to a non-inverting input terminal of the corresponding comparator (shown as "+" terminal in the illustration). Alternatively, in another embodiment the + and − terminals of the comparators may be exchanged. The calibration switches are operable to switchably, controllably, or selectively couple a fixed voltage generated by and/or output from the resistive ladder to the non-inverting input terminal of the corresponding comparator. In use, only one of the sample and calibration switches is coupled with the non-inverting input terminal of the corresponding comparator at a given time. For example, during calibration, the calibration switches are configured to a state to couple the fixed voltage from the resistive ladder to the non-inverting input terminals of the corresponding comparators of the column A/D conversion circuits, whereas during readout of image data from the pixel array the sample switches are configured to a state to couple the optionally amplified analog image data from the pixel array to the non-inverting input terminals of the corresponding comparators of the column A/D conversion circuits. In another embodiment, the two switches within each set may be replaced by other switching circuitry operable to perform the same switching function.

During use, after pixel array 404 has acquired its analog image data, the analog image data may be read out from the pixel array on bit lines 410. The analog image data may be amplified by optional column amplifiers 412. Sample switches 456 may be controlled to provide the amplified analog image data to non-inverting input terminals of comparators 416. Voltage ramp generator 423 may provide voltage ramp signal (VRAMP) to inverting input terminals of the comparators. In another implementation, the inverting and non-inverting terminals may be exchanged. The voltage ramp signal may follow a multiple slope (MS) voltage ramp (e.g., a saw tooth voltage ramp from 0V to a full scale voltage). Counter (e.g., N-bit counter) 424 may provide a counter signal to each latch 418, while the voltage ramp signal is being applied. The comparators may compare the input voltage ramp signal with the input analog image data. Latches (e.g., N-bit latches) 418 may latch the counter signal when the comparators determine that the voltage ramp signal matches the analog image data voltage. The latched counter signal may represent the digital image data converted from the analog image data, prior to adjustment with the calibration data.

Now obtaining calibration data will be described. Calibration data may be measured or otherwise obtained using the calibration circuitry during a calibration phase. During the calibration phase, instead of the output from the pixel array being coupled into the comparators, the calibration switches are controlled to couple the fixed voltages generated by the resistive ladder with the non-inverting input terminals of the comparators. In the illustrated embodiment, each branch of the resistive ladder is coupled to provide, through the calibration switches, a different fixed calibration voltage to each corresponding column A/D conversion circuit.

In some embodiments, two different types of A/D conversions are performed on the same set of fixed calibration voltages from the resistive ladder. In some embodiments, one A/D conversion is performed on the set of fixed calibration voltages from the resistive ladder using a single slope voltage ramp for the A/D conversion, and another A/D conversion is performed on the same set of fixed calibration voltages from the resistive ladder using a multiple slope voltage ramp for the A/D conversion. These conversions may be performed in either order. Preferably, the multiple slope voltage ramp is the same multiple slope voltage ramp that is to be used during A/D conversion of analog image data from the pixel array.

The image sensor may include a calibration controller (not shown) that is coupled with the calibration circuitry and the voltage ramp generator. In one phase of calibration, the calibration controller may be operable to control the voltage ramp generator to generate a multiple slope voltage ramp, and concurrently control the calibration circuitry to provide a first instance of the set of fixed calibration voltages from the resistive ladder (i.e., representing a first set of analog calibration data) to the column A/D conversion circuits. The first instance of the set of fixed calibration voltages from the resistive ladder may be converted to a first set of digital data (e.g., N-bit digital codes or values) with the set of column A/D converters using the multiple slope voltage ramp. The output of the column A/D conversion circuits in this phase of the calibration may represent the first set of digital data corresponding to the set of fixed calibration voltages as determined by the multiple slope voltage ramp (i.e., a set of multiple slope (MS) codes).

In another phase of the calibration, the calibration controller may be operable to control the voltage ramp generator to generate a single slope voltage ramp, and concurrently control the calibration circuitry to provide a second instance of the same set of fixed calibration voltages from the resistive ladder (i.e., representing a second set of analog calibration data) to the column A/D conversion circuits. The second instance of the same set of fixed calibration voltages from the resistive ladder may be converted to a second set of digital data (e.g., N-bit digital codes or values) with the set of column A/D converters using the single slope voltage ramp. The output of the column A/D conversion circuits in this other phase of the calibration may represent the second set of digital data corresponding to the same set of fixed calibration voltages as determined by the single slope voltage ramp (i.e., a set of single slope (SS) codes).

In some embodiments, a pixel array may include two non-imaging or "dummy" rows of pixels (not shown) that are to be used for calibration. In some embodiments, the calibration data may be obtained during a time when readout signals are applied to the two non-imaging rows of pixels. For example, the phase of the calibration using the multiple slope voltage ramp may be performed when readout signals are applied to a first of the two non-imaging rows of pixels, and the phase of the calibration using the single slope voltage ramp may be performed when readout signals are applied to a second of the two non-imaging rows of pixels. The readout signals may represent the usual control signals transmitted during readout for a row (e.g., pulses of reset and transfer gates, etc.). Using such non-imaging rows to obtain the calibration data may help to maintain timing symmetry but is not required. In some embodiments, the calibration data may be obtained on-the-fly during image acquisition by hardware on the image sensor chip. There is no requirement to store entire lines and then post-process.

In some embodiments, the calibration phase may occur once per frame where image data is acquired, although this is not required. For example, the calibration phase may be performed during a blanking period of the frame in which the image data is acquired. In one aspect, the calibration phase may be approximately equal to the time to readout two rows of pixels and complete two corresponding sets of A/D conversions. Accordingly, so long as the blanking period is greater than this amount of time, the frame rate of the image sensor will not be reduced. Alternatively, calibration need not be performed each frame. Calibration data may be obtained in one frame and reused for multiple or many frames. Commonly, the calibration data may tend to become stale over prolonged periods of time after acquisition, for example due to changes in operating temperature, power supply voltage, or other operating conditions. Periodic refreshment of the calibration data on a time frame on which such operating conditions change tends to be beneficial. In an aspect, the frequency of calibration may be adjustable, for example by the user, digital control logic, etc.

Figure 5:
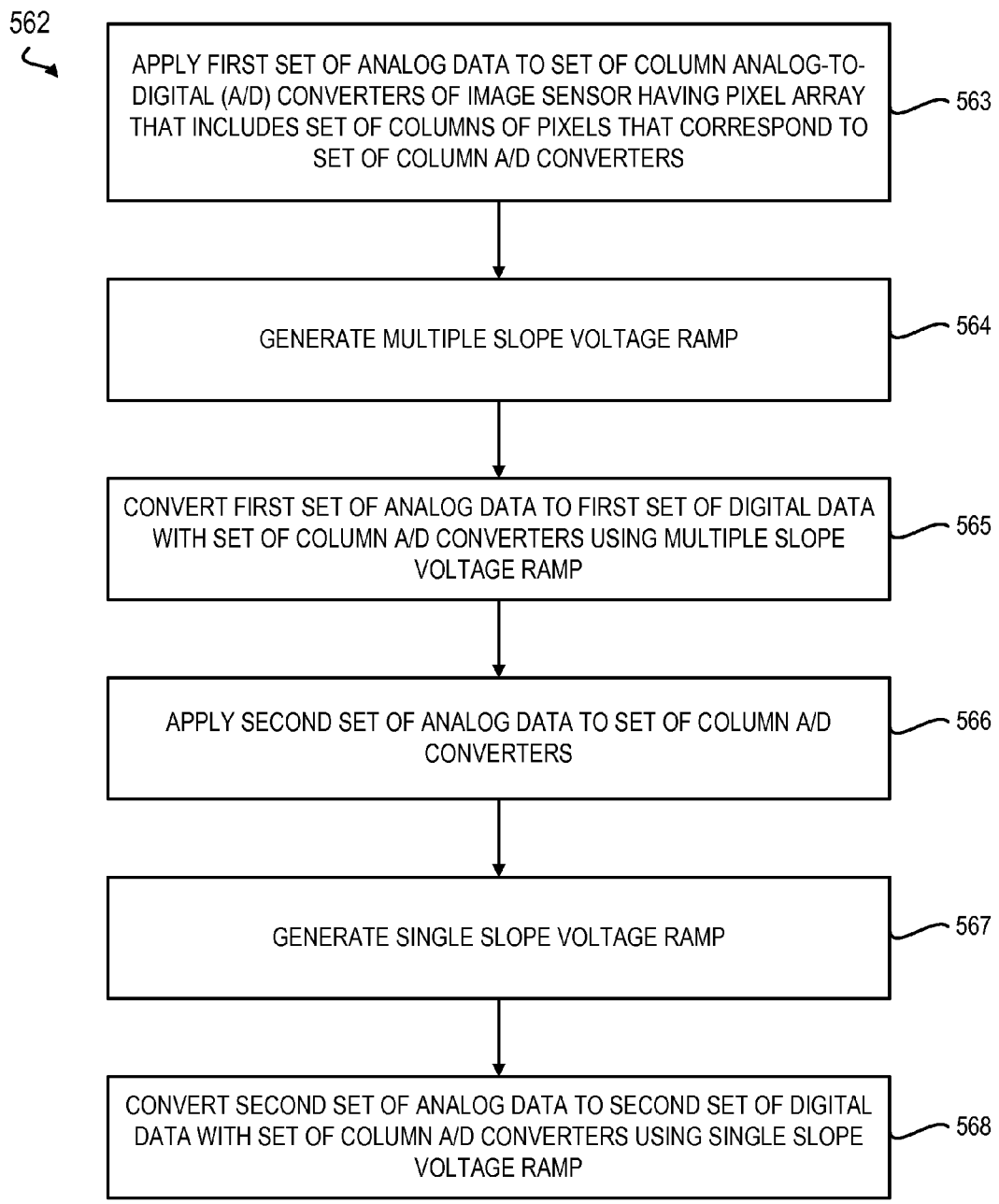
FIG. 5 is a block flow diagram of an example embodiment of a method of obtaining calibration data.

FIG. 5 is a block flow diagram of an example embodiment of a method 562 of obtaining calibration data. In some embodiments, the method may be performed using the image sensor and calibration circuitry of FIG. 4. Alternatively, the method may be performed by another image sensor entirely. Moreover, the image sensor of FIG. 4 may perform entirely different methods.

The method includes applying a first set of analog data to a set of column A/D converters of an image sensor, at block 563. In some embodiments, the first set of analog data is a first instance of a set of fixed voltages from a resistive ladder. The image sensor has a pixel array that includes a set of columns of pixels that correspond to the set of column A/D converters. A multiple slope voltage ramp is generated, at block 564. The first set of the analog data is converted to a first set of digital data with the set of column A/D converters using the multiple slope voltage ramp, at block 565.

A second set of analog data is applied to the set of column A/D converters, at block 566. In some embodiments, the second set of analog data is a second instance of the same set of the fixed voltages from the resistive ladder. A single slope voltage ramp is generated, at block 567. The second set of the analog data is converted to a second set of digital data with the set of column A/D converters using the single slope voltage ramp, at block 568. In some embodiments, the first and second sets of digital data may be stored or otherwise preserved as calibration data. In other embodiments, the first and second sets of digital data may be processed (e.g., regressed, fit to a curve or equation, statistically processed, averaged, extrapolated, etc.) into calibration data that may be stored or otherwise preserved.

The method described above is in a basic form, but operations may optionally be added to and/or removed from the method. In addition, while the figure shows a particular order of the operations according to an embodiment, it is to be understood that particular order is exemplary. Alternate embodiments may optionally perform the operations in different order, combine certain operations, overlap certain operations, etc. For example, the order of generating the single and multiple slope voltage ramps may be reversed in the method described above. Also, the operations of blocks 564-565 may be overlapped and the operations of blocks 567-568 may be overlapped.

Figure 6:
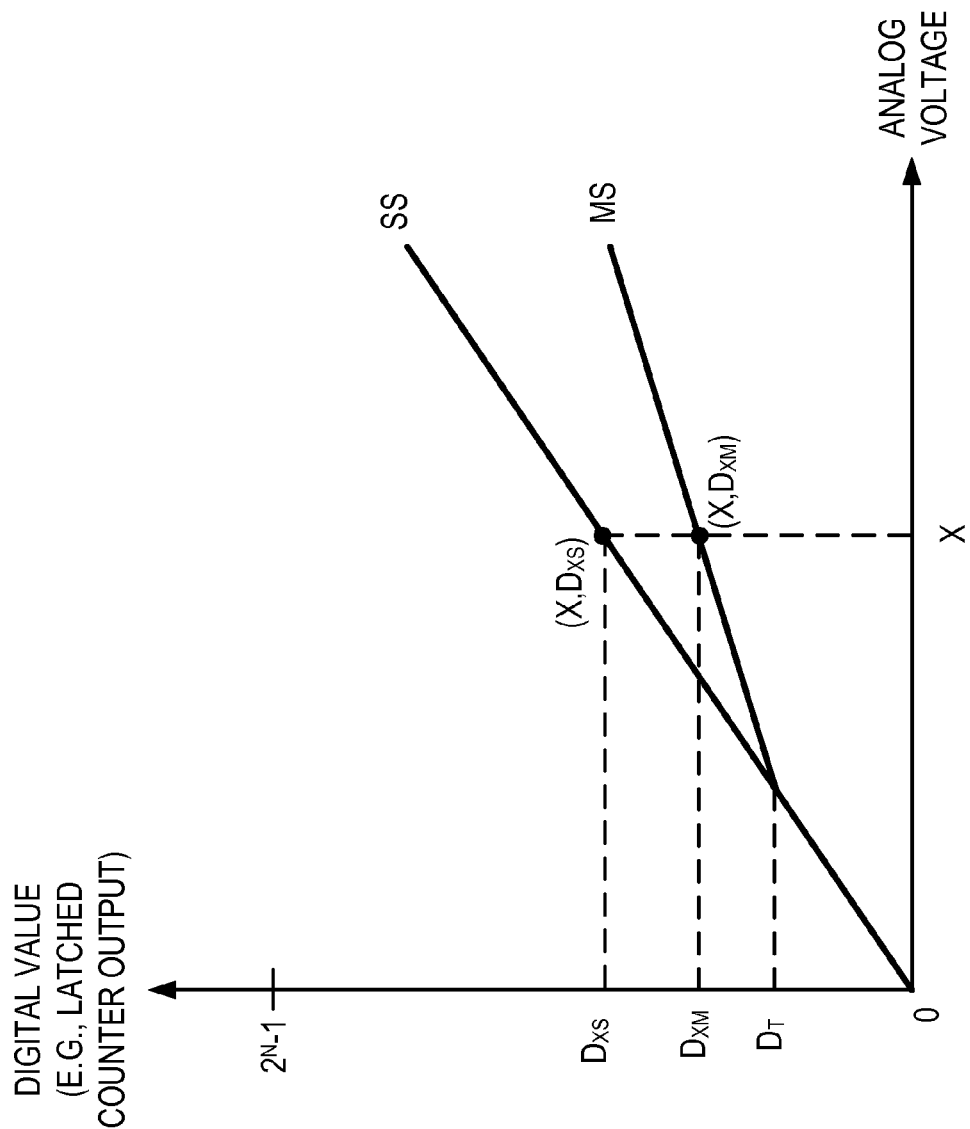
FIG. 6 is a graph illustrating example digital values obtained for analog calibration voltages using single slope voltage ramp and multiple slope voltage ramp analog-to-digital conversions.

FIG. 6 is a graph illustrating digital values obtained for analog calibration voltages using single slope voltage ramp (i.e., SRSS) and multiple slope voltage ramp (i.e., SRMS) A/D conversions. In the graph, analog voltage is plotted on the horizontal axis, and corresponding digital values (counter output) is plotted on the vertical axis. Single slope (SS) line plots the output of each of the column A/D conversion circuits, while the voltage ramp generator outputs a single slope voltage ramp. This SS line represents the digital SS codes determined for the corresponding analog voltages. Multiple slope (MS) lines plot the output of each of the column A/D conversion circuits, while the voltage ramp generator outputs a multiple slope voltage ramp. This MS line represents the digital MS codes determined for the corresponding analog voltages. The SS and MS lines coincide on the left side of the graph where the ramp voltages overlap. All digital codes from 0 to $D_T$, where $D_T$ represents the output of the column A/D conversion circuit at the voltage where the multiple slope ramp changes in slope, the SS and MS codes are the same. As the MS and SS lines diverge, the MS codes become increasingly smaller than the SS codes, since each increment in the calibration code for the multiple slope voltage ramp involves a larger voltage change. For example, for the same fixed analog calibration voltage X, the SS code is $D_{XS}$, which is greater than the MS code which is D. The data plotted represents an example embodiment of calibration data.

A first set of digital data determined for analog data using a multiple slope voltage ramp (e.g., SRMS A/D conversion), and a second set of digital data corresponding to analog data using a single slope voltage ramp (e.g., SRSS A/D conversion) may allow digital data determined by the multiple slope voltage ramp (e.g., SRMS A/D conversion) to be mapped or related to digital data determined by a single slope voltage ramp (e.g., SRSS A/D conversion). They may be used as calibration data, or help to generate calibration data, that relates digital data converted from analog data using a multiple slope voltage ramp to digital data converted from analog data using a single slope voltage ramp. In some embodiments, the calibration data may relate the difference in times taken by a single slope voltage ramp and a multiple slope voltage ramp to reach each of the different fixed voltages input to the A/D converters by the resistive ladder. In some embodiments, for all the different voltages in the voltage range used for calibration, both a counter value achieved for that voltage under a single slope voltage ramp and a counter value achieved for that voltage under a multiple slope voltage ramp may be obtained. As discussed above, the calibration data may help to account for the different MS codes reached by the counter when steeper or different slopes are used, as well as help to account for the aforementioned non-idealities and thereby help to improve image quality.

Various different forms of the calibration data are possible. The calibration data may take the form of pairs of data values in a table, equations, curves, or a combination thereof. SS code values related to MS code values represents a first example embodiment of calibration data. As an example, the calibration data may take the form of a table (e.g., a hardware table) including pairs of corresponding SS and MS code values both determined for the same set of calibration voltages. Alternatively, instead of pairs of values, equations relating SS codes to MS codes represent a second example embodiment of calibration data. As an example, a regression equation may be fit to SS code values and MS code values determined for known corresponding calibration voltages. As yet another option, rather than relating SS codes to MS codes, differences between SS and MS codes may be related to MS codes. For example, a table, equation, or curve relating differences between SS and MS codes to MS codes may represent yet another example embodiment of calibration data. The differences between the MS and SS codes may be added, subtracted, or otherwise combined with the MS codes to convert the MS codes to SS codes. As a still further example, differences between measured MS codes and theoretical/expected MS codes (e.g., based on the expected ideal slope transition and ideal straight lines) may be stored to account for non-idealities or deviations from the theoretical/expected MS codes. Combinations of such approaches may also be used (e.g., a look up table and extrapolation equations when outside of the look up table). These are just a few illustrative examples. Other embodiments of calibration data are also contemplated.

To further illustrate certain concepts, a particular detailed example of forming a calibration data from sets of SRSS and SRMS codes will be described, although the scope of the invention is not so limited. Once the SRSS and SRMS calibration codes for the fixed set of analog voltages from the resistive ladder have been obtained, a calibration table may be formed. One method of forming the calibration table with the SRSS and SRMS code is to store the calibration codes for both calibration A/D conversions. For example, at the calibration of column X, the SRSS code $D_{XS}$ and the SRMS code $D_{XM}$ may be stored. If one or both of these codes are readout out of N-bit latch and into an on-chip or off-chip semiconductor memory such as a line buffer, the data point ($D_{XS}$, $D_{XM}$) can be stored as one point of calibration data. However, this method of calibration table construction generally is performed with at least one line buffer.

Another method of forming a calibration table with the SRSS and SRMS codes is to first set the ramp generator to output a multiple slope ramp. Each output of the SRMS code is read in some order, such as, from the leftmost column A/D conversion circuit to the rightmost column A/D conversion circuit, and a smoothing filter, such as a moving average filter, may optionally be applied to the raw data. While reading the outputs, a table of length P is constructed whose index corresponds to P consecutive codes around the SRMS code at the point where the slope of ramp voltage changes. P is equal to the number of codes in the table, and is based on the desired width of the transition region where the slope is changing over which to perform calibration. The number of codes P may range from relatively small number to a relatively large number as desired. The table is populated with the column numbers of the first occurrences of the P codes. Then the ramp generator is set to output a single slope ramp. Each output of the SRSS code is read in the same order the SRMS code is read out in. A smoothing filter, such as a moving average filter, is optionally applied to the raw data. While reading the columns, whenever the column number matches an entry in the table, that entry may be replaced with the output of that column's SRSS code. Accordingly, the SRMS codes are swapped out for the corresponding SRSS codes.

When using the calibration data to adjust the digital image data output from the A/D conversion circuits, when the output of the SRMS A/D conversion code is smaller than the smallest of the P codes of the calibration table, then the SRMS A/D conversion code may be taken as the same as the SRSS A/D conversion code. When the SRMS A/D conversion code is among the P codes of the calibration table, then the calibration table may be used to map the SRMS A/D conversion code to the SRSS A/D conversion code. When the SRMS A/D conversion code is greater than the largest of the P codes of the calibration table, then the SRSS A/D conversion code may be estimated by extrapolating the calibration data (e.g., by linearly extrapolating the last segment of the codes of the calibration table using information on the slope transition point and the slope after the transition). An image sensor and/or a camera or other electronic device having an image sensor may include a component to adjust the digital data using the calibration data. The component may be implemented in hardware, firmware, software, or a combination thereof. For example, in one embodiment, a circuit at the output of the A/D converters may adjust the digital data using the calibration data.

Figure 7:
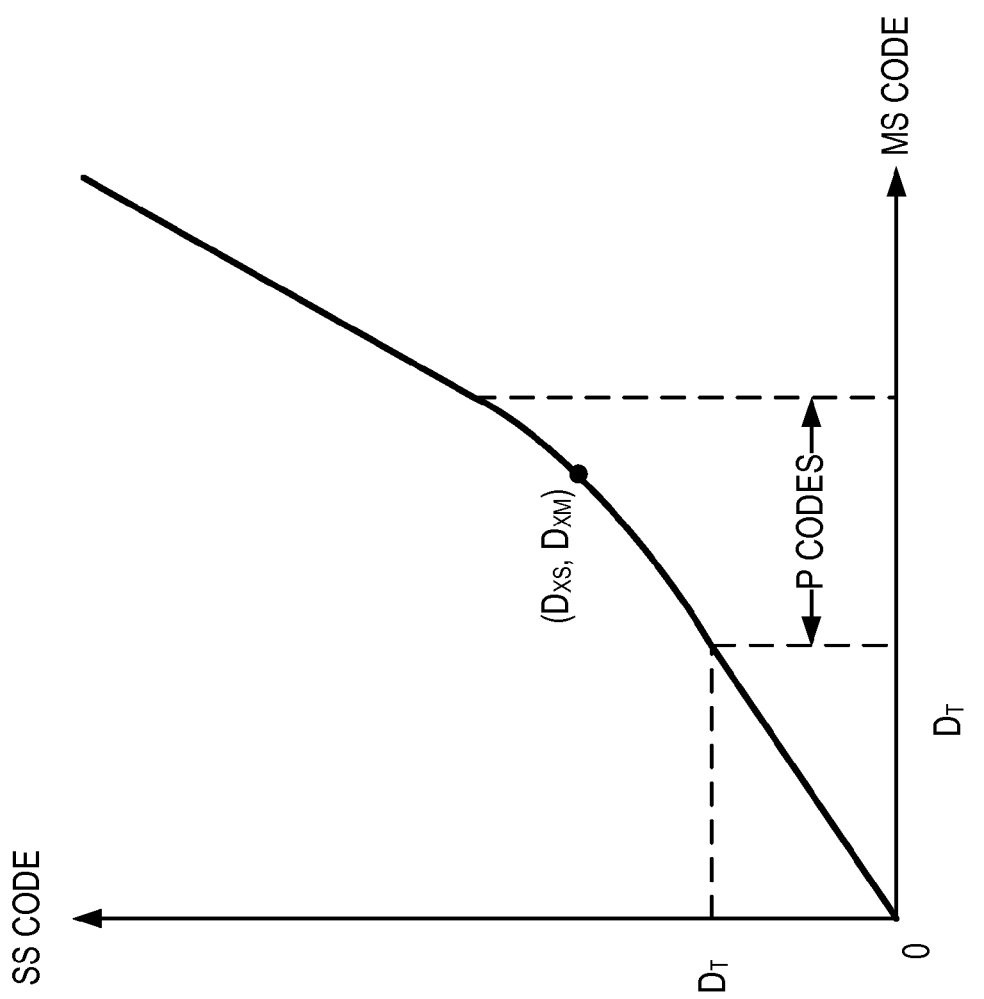
FIG. 7 is a graph illustrating an example embodiment of calibration data.

FIG. 7 is a graph illustrating an example embodiment of calibration data including a set of corresponding MS and SS codes. The MS codes are plotted on the horizontal axis and the SS codes on the vertical axis. In this embodiment, P digital codes in the MS conversion are used within a calibration range about a slope transition. As shown clearly in this illustration, non-idealities may give rise to something other than perfectly straight lines having the desired slopes at and around the transition and this is reflected in the calibration data. An example pair of MS and SS codes corresponding to a given analog voltage X are shown at a point ($D_{XS}$, $D_{XM}$).

In the examples above, two different slopes have been used in the multiple slope voltage ramps. In other embodiments, three, four, or more different slopes may be used. In yet another embodiment, a continuously changing slope or curved slope may be used (e.g., a continuously accelerating slope over a highest signal value portion of the range). As used herein the term "multiple slope" encompasses such continuously changing or curved slopes. The directions of the changes in the slope may be increasing, decreasing, or alternating between increasing and decreasing. Calibration data as disclosed herein may cover at least some, a majority, or substantially all of the range over which the slope changes.

The image sensors disclosed herein may be included in a digital still camera, digital video camera, camera phone, picture phone, video phone, camcorder, webcam, camera in a computer system, security camera, medical imaging device, optical mouse, toy, game, scanner, automotive image sensor, or other types of electronic image and/or video acquisition device. Depending on the implementation, the electronic image and/or video acquisition device may also include other components, such as, for example, a light source to emit light, one or more lenses optically coupled to focus light on the array of pixels, a shutter optically coupled to allow light to pass through the one or more lenses, a processor to process image data, and a memory to store image data, to name just a few examples.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other. For example, a calibration circuit may be coupled with a column A/D conversion circuit via an intervening switch.

In the description above, for the purposes of explanation, numerous specific details have been set forth in order to provide a thorough understanding of the embodiments of the invention. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known circuits, structures, devices, and operations have been shown in block diagram form or without detail in order to avoid obscuring the understanding of the description.

It will also be appreciated, by one skilled in the art, that modifications may be made to the embodiments disclosed herein, such as, for example, to the configurations, functions, and manner of operation and use, of the components of the embodiments. All equivalent relationships to those illustrated in the drawings and described in the specification are encompassed within embodiments of the invention. Further, where considered appropriate, reference numerals or terminal portions of reference numerals have been repeated among the figures to indicate corresponding or analogous elements, which may optionally have similar characteristics.

Various operations and methods have been described. Some of the methods have been described in a basic form in the flow diagrams, but operations may optionally be added to and/or removed from the methods. In addition, while the flow diagrams show a particular order of the operations according to example embodiments, it is to be understood that that particular order is exemplary. Alternate embodiments may optionally perform the operations in different order, combine certain operations, overlap certain operations, etc. Many modifications and adaptations may be made to the methods and are contemplated.

One or more embodiments include an article of manufacture (e.g., a computer program product) that includes a machine-accessible and/or machine-readable medium. The medium may include, a mechanism that provides, for example stores, information in a form that is accessible and/or readable by the machine. The machine-accessible and/or machine-readable medium may provide, or have stored thereon, one or more or a sequence of instructions and/or data structures that if executed by a machine causes or results in the machine performing, and/or causes the machine to perform, one or more or a portion of the operations or methods or the techniques shown in the figures disclosed herein.

In one embodiment, the machine-readable medium may include a tangible non-transitory machine-readable storage media. For example, the tangible non-transitory machine-readable storage media may include a floppy diskette, an optical storage medium, an optical disk, a CD-ROM, a magnetic disk, a magneto-optical disk, a read only memory (ROM), a programmable ROM (PROM), an erasable-and-programmable ROM (EPROM), an electrically-erasable-and-programmable ROM (EEPROM), a random access memory (RAM), a static-RAM (SRAM), a dynamic-RAM (DRAM), a Flash memory, a phase-change memory, or a combinations thereof. The tangible medium may include one or more solid or tangible physical materials, such as, for example, a semiconductor material, a phase change material, a magnetic material, etc.

Examples of suitable machines include, but are not limited to, digital cameras, digital video cameras, cellular telephones, computer systems, other electronic devices having pixel arrays, and other electronic devices capable of capturing images. Such electronic devices typically include one or more processors coupled with one or more other components, such as one or more storage devices (non-transitory machine-readable storage media). Thus, the storage device of a given electronic device may stores code and/or data for execution on the one or more processors of that electronic device. Alternatively, one or more parts of an embodiment of the invention may be implemented using different combinations of software, firmware, and/or hardware.

It should also be appreciated that reference throughout this specification to "one embodiment", "an embodiment", or "one or more embodiments", for example, means that a particular feature may be included in the practice of the invention (e.g., in at least one embodiment). Similarly, it should be appreciated that in the description various features are sometimes grouped together in a single embodiment, Figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. A method comprising:
    applying a first set of analog data to a set of column analog-to-digital (A/D) converters of an image sensor having a pixel array that includes a set of columns of pixels that correspond to the set of column A/D converters, wherein applying the first set of the analog data comprises applying a first instance of a set of fixed voltages spanning a calibration voltage range to the set of the column A/D converters;
    generating a multiple slope voltage ramp;
    converting the first set of the analog data to a first set of digital data with the set of column A/D converters using the multiple slope voltage ramp;
    applying a second set of analog data to the set of column A/D converters, wherein applying the second set of the analog data comprises applying a second instance of the same set of fixed voltages spanning the calibration voltage range to the set of the column A/D converters;
    generating a single slope voltage ramp; and
    converting the second set of the analog data to a second set of digital data with the set of column A/D converters using the single slope voltage ramp.

2. The method of claim 1, further comprising preserving, as calibration data, one of:
    the first and second sets of digital data; and
    a relation between the first and second sets of digital data.

3. The method of claim 1, wherein the first set of the analog data is not image data, and wherein the second set of the analog data is not image data.

4. The method of claim 1, further comprising:
    applying readout signals to a first non-imaging row of pixels of the pixel array while generating the multiple slope voltage ramp; and
    applying readout signals to a second non-imaging row of pixels of the pixel array while generating the single slope voltage ramp.

5. The method of claim 1, wherein the method is performed during a period when a frame comprising image data is acquired with the pixel array.

6. The method of claim 5, wherein the method is performed during a blanking period during the period when the frame is acquired.

7. A method comprising:
    providing a first set of voltages to a set of column analog-to-digital (A/D) converters that correspond to a set of columns of pixel cells, wherein providing the first set of the voltages comprises providing a first instance of a set of fixed voltages spanning a calibration voltage range to the set of the column A/D converters;
    converting the first set of the voltages to a first set of digital levels with the set of column A/D converters using a multiple slope voltage ramp;
    providing a second set of voltages to the set of column A/D converters, wherein providing the second set of the voltages comprises providing a second instance of the same set of fixed voltages spanning the calibration voltage range to the set of the column A/D converters;
    converting the second set of the voltages to a second set of digital levels with the set of column A/D converters using a single slope voltage ramp.

8. The method of claim 7, further comprising preserving, as calibration data, one of:
    the first and second sets of digital levels; and
    a relation between the first and second sets of digital levels.

9. The method of claim 7, wherein the first set of the voltages does not represent image data, and wherein the second set of the voltages does not represent image data.

10. The method of claim 7, further comprising:
    applying readout signals to a first non-imaging row of pixel cells while generating the multiple slope voltage ramp; and
    applying readout signals to a second non-imaging row of pixel cells while generating the single slope voltage ramp.

11. The method of claim 7, wherein the method is performed during a period when a frame comprising image data is acquired with the pixel array.

* * * * *